United States Patent
Park et al.

(10) Patent No.: US 10,800,383 B2
(45) Date of Patent: Oct. 13, 2020

(54) OPTICAL SENSOR, RAIN SENSOR AND VEHICLE

(71) Applicants: HYUNDAI MOTOR COMPANY, Seoul (KR); KIA MOTORS CORPORATION, Seoul (KR); Accendo Motion Research Co., Ltd., Jeollabuk-do (KR)

(72) Inventors: Jong Min Park, Hwaseong-si (KR); Nak Kyoung Kong, Seongnam-si (KR); Seung Hyeok Chang, Suwon-si (KR); Ki Hong Lee, Seoul (KR); Nam Joon Yoo, Jeollabuk-do (KR); Yong Pyo Hong, Jeollabuk-do (KR)

(73) Assignees: Hyundai Motor Company, Seoul (KR); KIA Motors Corporation, Seoul (KR); Accendo Motion Research Co., Ltd., Jeollabuk-do (KR)

( * ) Notice: Subject to any disclaimer, the term of this patent is extended or adjusted under 35 U.S.C. 154(b) by 152 days.

(21) Appl. No.: 16/035,304

(22) Filed: Jul. 13, 2018

(65) Prior Publication Data
US 2019/0291697 A1    Sep. 26, 2019

(30) Foreign Application Priority Data
Mar. 23, 2018 (KR) .................. 10-2018-0033893

(51) Int. Cl.
*B60S 1/08* (2006.01)
*G01K 7/25* (2006.01)
(Continued)

(52) U.S. Cl.
CPC .......... *B60S 1/0833* (2013.01); *B60S 1/0866* (2013.01); *G01K 7/25* (2013.01); *H04B 10/502* (2013.01);
(Continued)

(58) Field of Classification Search
CPC ........ B60S 1/0833; B60S 1/087; H05B 45/10; G01K 7/25; H04B 10/502; H01L 31/101
See application file for complete search history.

(56) References Cited

U.S. PATENT DOCUMENTS 3,705,316 A * 12/1972 Burrous .............. H05B 45/395
                                                    327/513
4,871,917 A * 10/1989 O'Farrell ............. B60S 1/0822
                                                    250/341.7
(Continued)

FOREIGN PATENT DOCUMENTS

JP     2007085840       4/2007
JP     2008078437       4/2008
(Continued)

OTHER PUBLICATIONS

Denso Corp.—JP 4687979 B2—Google Patents English Translation obtained Aug. 13, 2020 (Year: 2020).*

*Primary Examiner* — David P Porta
*Assistant Examiner* — Jeremy S Valentiner
(74) *Attorney, Agent, or Firm* — Brinks Gilson & Lione

(57) ABSTRACT

The present disclosure provides an optical sensor having constant sensitivity regardless of changes in temperature. The optical sensor may include a light emitting device configured to emit light; a light receiving device configured to receive the light emitted from the light emitting device, and to output current based on an intensity of the light; a temperature sensor coupled with the light emitting device, and having electrical resistance varying with temperature; and a microcontroller including a first channel for supplying first current directly to the light emitting device, a second channel for supplying second current to the light emitting device via the temperature sensor, and a third channel for receiving the current output from the light receiving device.

14 Claims, 17 Drawing Sheets

(51) Int. Cl.
    *H04B 10/50*  (2013.01)
    *H01L 31/101*  (2006.01)
    *H05B 45/10*  (2020.01)
    *H05B 45/18*  (2020.01)
(52) U.S. Cl.
    CPC ............. *H05B 45/10* (2020.01); *H05B 45/18* (2020.01); *B60S 1/087* (2013.01); *H01L 31/101* (2013.01)

(56) References Cited

U.S. PATENT DOCUMENTS

| | | | | |
|---|---|---|---|---|
| 5,386,111 | A * | 1/1995 | Zimmerman | B60S 1/0822 250/227.25 |
| 6,239,444 | B1 * | 5/2001 | Tanaka | B60S 1/0818 250/573 |
| 9,237,625 | B1 * | 1/2016 | Mays, II | H05B 45/10 |
| 2009/0079357 | A1 * | 3/2009 | Shteynberg | H05B 45/20 315/291 |
| 2011/0062895 | A1 * | 3/2011 | Ji | H01B 45/10 315/309 |
| 2017/0001601 | A1 * | 1/2017 | Lee | B60S 1/0837 |

FOREIGN PATENT DOCUMENTS

| | | | | |
|---|---|---|---|---|
| JP | 2008102159 | | 5/2008 | |
| JP | 2011013252 | | 1/2011 | |
| JP | 4687979 | B2 * | 5/2011 | ............ G01N 21/17 |
| JP | 2012134356 | | 7/2012 | |
| KR | 10-1412925 | | 3/2010 | |

* cited by examiner

OPTICAL SENSOR, RAIN SENSOR AND VEHICLE

CROSS-REFERENCE TO RELATED APPLICATION(S)

The present application claims priority to and the benefit of Korean Patent Application No. 10-2018-0033893, filed on Mar. 23, 2018, which is incorporated by reference herein in its entirety.

FIELD

Forms of the present disclosure relate to an optical sensor, a rain sensor, and a vehicle having the same, and more particularly to an optical sensor and a rain sensor including a circuit for temperature compensation, and a vehicle including the same.

BACKGROUND

The statements in this section merely provide background information related to the present disclosure and may not constitute prior art.

An optical sensor is widely used in various fields such as distance measurement and object detection. For example, it is common that a rain sensor for a vehicle that detects rainfall uses an optical sensor.

In general, an optical sensor includes a light emitting device for emitting light, such as infrared rays, visible light, and ultraviolet light, and a light receiving device for receiving light emitted from the light emitting device, and the optical sensor performs operations, such as distance measurement and object detection, based on an amount of light received by the light receiving device.

Since the optical sensor operates based on the amount of light received by the light receiving device, the operation of the optical sensor is greatly affected by an amount of light emitted from the light emitting device. Therefore, the optical sensor controls the light emitting device to keep an emission amount of light constant.

In addition, a light emitting diode (LED) is widely used as a light emitting device, and the LED is known to change an emission amount of light according to temperature.

Accordingly, when temperature changes, the optical sensor may malfunction to become excessively sensitive or insensitive.

SUMMARY

Therefore, it is a form of the present disclosure to provide an optical sensor and a rain sensor having constant sensitivity regardless of changes in temperature, and a vehicle including the same.

It is another form of the present disclosure to provide an optical sensor and a rain sensor including a light emitting device that emits a constant amount of light regardless of changes in temperature, and a vehicle including the same.

It is another form of the present disclosure to provide an optical sensor and a rain sensor including a temperature compensation circuit, and a vehicle including the same.

It is another form of the present disclosure to provide an optical sensor and a rain sensor including a temperature compensation circuit using a thermistor, and a vehicle including the same.

In accordance with one form of the present disclosure, an optical sensor includes: a light emitting device configured to emit light; a light receiving device configured to receive the light emitted from the light emitting device, and to output current based on an intensity of the received light; a temperature sensor coupled with the light emitting device, and having electrical resistance varying with temperature; and a microcontroller including a first channel for supplying current directly to the light emitting device, a second channel for supplying current to the light emitting device via the temperature sensor, and a third channel for receiving current output from the light receiving device.

The microcontroller may supply current to the light emitting device through the first channel and the second channel, alternately.

The microcontroller may determine a setting value of current to be supplied to the light emitting device through the first channel based on the current output from the light receiving device, while supplying the current to the light emitting device through the second channel.

The microcontroller may supply the current having the setting value to the light emitting device through the first channel, and measure current output from the light receiving device.

The microcontroller may decrease a setting value of current to be supplied directly to the light emitting device through the first channel when current output from the light receiving device increases, while supplying the current to the light emitting device through the second channel.

The microcontroller may increase a setting value of current to be supplied directly to the light emitting device through the first channel when current output from the light receiving device decreases, while supplying current to the light emitting device through the second channel.

In accordance with another form of the present disclosure, a rain sensor includes: first and second light emitting devices configured to emit light; a light receiving device configured to receive the light emitted from at least one of the first or second light emitting devices, and to output current based on an intensity of the received light; a temperature sensor coupled with the second light emitting device, and having electrical resistance varying with temperature; and a microcontroller including a first channel for supplying current directly to the first light emitting device, a second channel for supplying current to the second light emitting device via the temperature sensor, and a third channel for receiving current output from the light receiving device.

The microcontroller may determine a setting value of current to be supplied to the first light emitting device based on the current output from the light receiving device, while supplying the current to the second light emitting device.

The microcontroller may supply the current having the setting value to the first light emitting device, and determine whether it rains based on the current output from the light receiving device.

The microcontroller may supply current to the first light emitting device through the first channel, and when the current output from the light receiving device is greater than a predetermined upper limit value, the microcontroller may decease a setting value of current to be supplied to the first light emitting device through the first channel.

The microcontroller may supply current to the first light emitting device through the first channel, and when the current output from the light receiving device is smaller than a predetermined lower limit value, the microcontroller may increase a setting value of current to be supplied to the first light emitting device through the first channel.

The microcontroller may supply current to the second light emitting device through the second channel, and when the current output from the light receiving device increases while the microcontroller supplies the current to the second light emitting device through the second channel, the microcontroller may decrease a setting value of current to be supplied to the first light emitting device through the first channel.

The controller may supply current to the second light emitting device through the second channel, and when the current output from the light receiving device increases while the microcontroller supplies the current to the second light emitting device through the second channel, the microcontroller may decrease a setting value of current to be supplied to the first light emitting device through the first channel.

In accordance with another form of the present disclosure, a vehicle includes: a front window; a rain sensor configured to detect raindrops on the front window; a wiper configured to remove the raindrops on the front window; and a controller configured to operate the wiper based on a signal from the rain sensor, wherein the rain sensor includes: first and second light emitting devices configured to emit light; a light receiving device configured to receive the light emitted from at least one of the first and second light emitting devices, and to output current based on an intensity of the received light; a temperature sensor coupled with the second light emitting device, and having electrical resistance varying with temperature; and a microcontroller including a first channel for supplying current directly to the first light emitting device, a second channel for supplying current to the second light emitting device via the temperature sensor, and a third channel for receiving current output from the light receiving device.

Additional form of the present disclosure will be set forth in part in the description which follows and, in part, will be obvious from the description, or may be learned by practice of the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
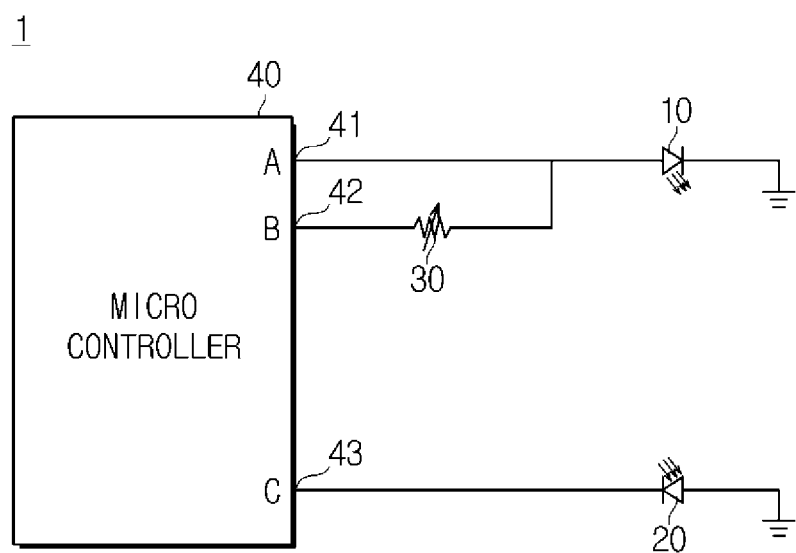
FIG. 1 is a circuit diagram of an optical sensor in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing operations described is an example; however, the sequence of and/or operations is not limited to that set forth herein and may be changed as is known in the art, with the exception of operations necessarily occurring in a particular order. In addition, respective descriptions of well-known functions and constructions may be omitted for increased clarity and conciseness.

Additionally, exemplary forms of the present disclosure will now be described more fully hereinafter with reference to the accompanying drawings. The exemplary forms of the present disclosure may, however, be embodied in many different forms and should not be construed as being limited to the forms set forth herein. These forms are provided so that this disclosure will be thorough and complete and will fully convey the exemplary forms to those of ordinary skill in the art. Like numerals denote like elements throughout.

It will be understood that, although the terms first, second, etc. may be used herein to describe various elements, these elements should not be limited by these terms. These terms are only used to distinguish one element from another. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present.

The terminology used herein is for the purpose of describing particular forms only and is not intended to be limiting. As used herein, the singular forms "a," "an," and "the," are intended to include the plural forms as well, unless the context clearly indicates otherwise.

Reference will now be made in detail to the exemplary forms of the present disclosure, examples of which are illustrated in the accompanying drawings, wherein like reference numerals refer to like elements throughout.

The expression, "at least one of a, b, and c," should be understood as including only a, only b, only c, both a and b, both a and c, both b and c, or all of a, b, and c.

Reference will now be made in detail to forms of the present disclosure, examples of which are illustrated in the accompanying drawings.

Figure 2:
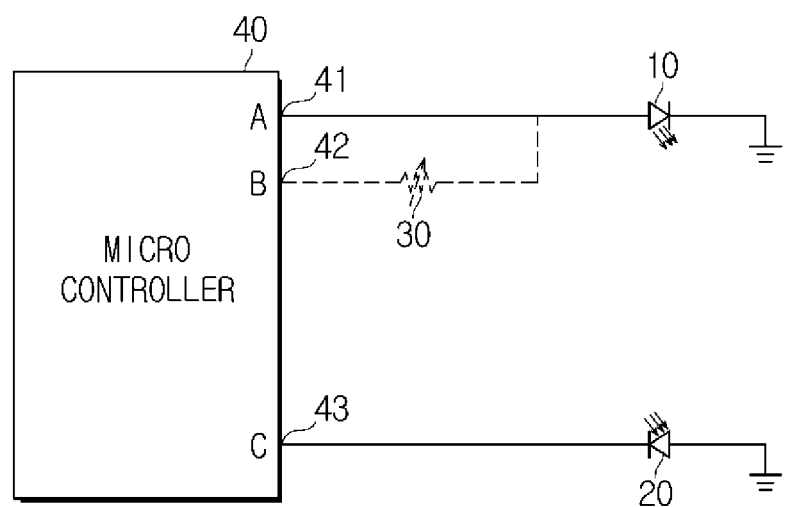
FIG. 2 is a view for describing a sensing operation of an optical sensor in one form of the present disclosure.
Figure 3:
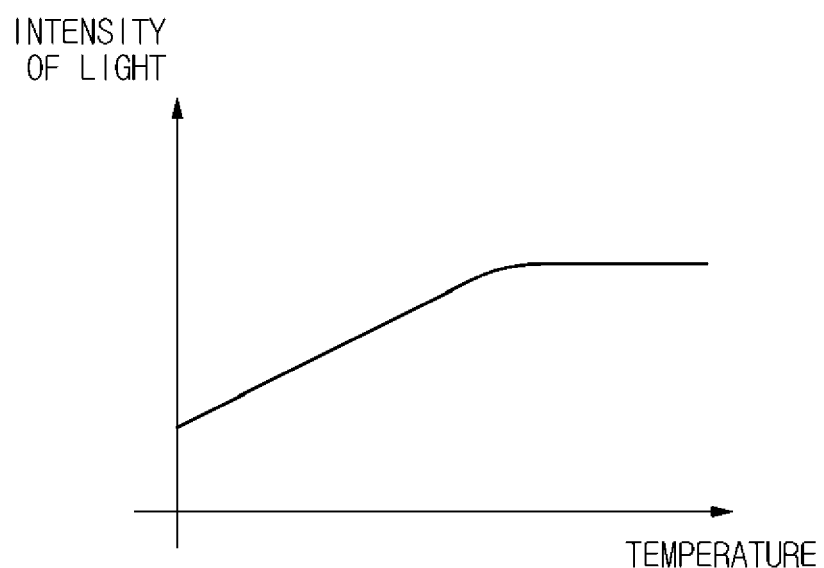
FIG. 3 is a graph showing a relation between temperature obtained by a temperature compensation operation shown in FIG. 2 and an output of a light emitting device.
Figure 4:
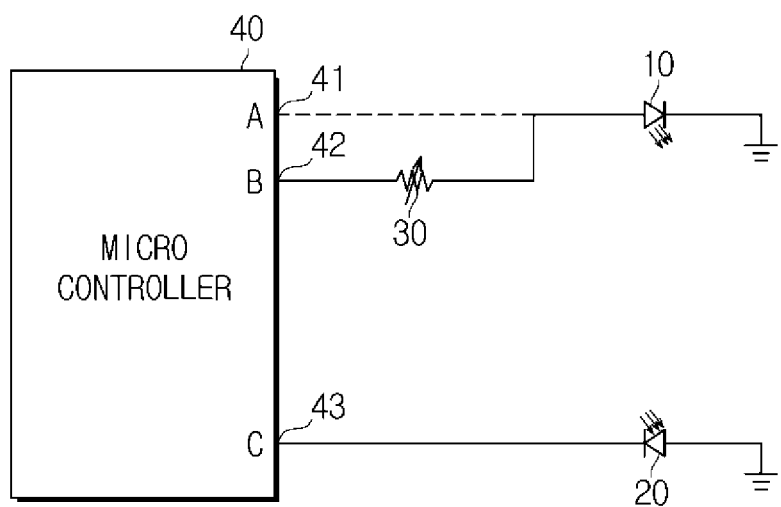
FIG. 4 is a view for describing a temperature compensation operation of an optical sensor in one form of the present disclosure.
Figure 5:
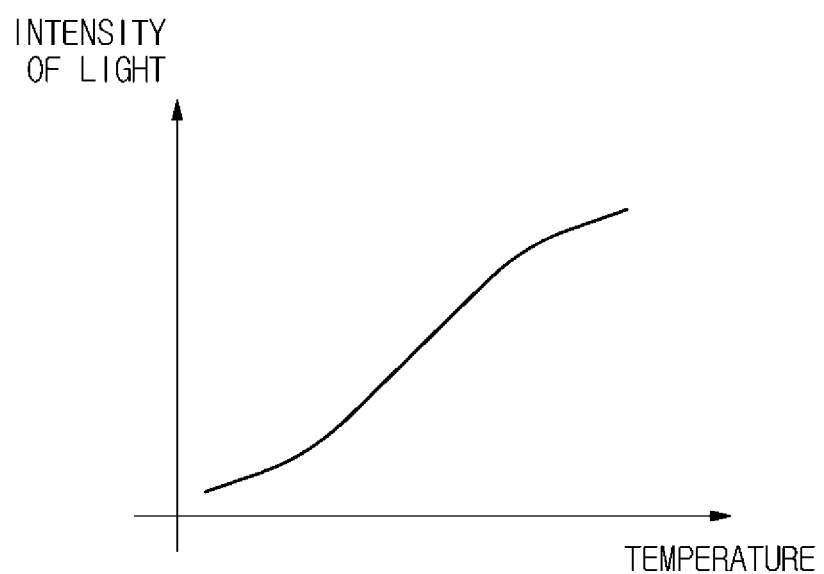
FIG. 5 is a graph showing a relation between temperature obtained by the temperature compensation operation shown in FIG. 4 and an output of a light emitting device.

FIG. 1 is a circuit diagram of an optical sensor in some forms of the present disclosure. FIG. 2 is a view for describing a sensing operation of an optical sensor in some forms of the present disclosure. FIG. 3 is a graph showing a relation between temperature obtained by a temperature compensation operation shown in FIG. 2 and an output of a light emitting device. FIG. 4 is a view for describing a temperature compensation operation of an optical sensor in some forms of the present disclosure. FIG. 5 is a graph showing a relation between temperature obtained by the temperature compensation operation shown in FIG. 4 and an output of a light emitting device.

Referring to FIG. 1, an optical sensor 1 may include a light emitting device 10 for emitting light, a light receiving device 20 for receiving light, a temperature sensor 30 having an electrical characteristic changing according to temperature, and a microcontroller 40 for controlling an operation of the optical sensor 1.

The light emitting device 10 may convert electrical energy into optical energy. In other words, the light emitting device 10 may be supplied with power, and emit light having a predetermined wavelength (or frequency). For example, the light emitting device 10 may emit infrared light, visible light (red light, green light, blue light and/or white light), or ultraviolet light.

The light emitting device 10 may emit light of different intensities (or different amounts of light) depending on different magnitudes of received current. Specifically, as a magnitude of received current increases, an intensity of light emitted by the light emitting device 10 may increase.

The light emitting device 10 may emit light under a control of the microcontroller 40. The light emitting device 10 may receive current from the microcontroller 40 through an A channel 41 or a B channel 42.

The light emitting device 10 may be, for example, a light emitting diode (LED).

The light receiving device 20 may convert optical energy into electrical energy. In other words, the light receiving device 20 may receive light and output current. For example, the light receiving device 20 may receive infrared light, visible light (red light, green light, blue light and/or white light), or ultraviolet light, and output current. The light receiving device 20 may receive light emitted from the light emitting device 10 or light emitted from the light emitting device 10 and then reflected from an object.

The light receiving device 20 may output different magnitudes of current depending on different intensities of received light. Specifically, as an intensity of received light increases, a magnitude of current output from the light receiving device 20 may increase accordingly.

The light receiving device 20 may output current corresponding to an intensity of received light to the microcontroller 40. The light receiving device 20 may output the current to the microcontroller 40 through a C channel 43 of the microcontroller 40.

The light receiving device 20 may be, for example, a photo diode.

An electrical characteristic of the temperature sensor 30 may vary depending on temperature. For example, an electrical resistance value of the temperature sensor 30 may change depending on temperature. The electrical resistance value of the temperature sensor 30 may vary approximately linearly with temperature.

The temperature sensor 30 may be a thermistor whose electrical resistance value varies with temperature. The thermistor may be classified into a positive temperature coefficient thermistor (PTC thermistor) and a negative temperature coefficient thermistor (NTC thermistor) according to a temperature coefficient of a resistor. The electrical resistance value of the PCT thermistor increases as temperature increases, and the electrical resistance value of the NTC thermistor decreases as temperature increases. In particular, when a predetermined voltage is applied to the thermistors, current of the PTC thermistor decreases as temperature increases, and current of the NTC thermistor increases as temperature increases.

For easy understanding, the temperature sensor 30 is assumed to be a NPC thermistor in the following description.

One end of the temperature sensor 30 may be coupled with the B channel 42 of the microcontroller 40, and the other end of the temperature sensor 30 may be coupled with the light emitting device 10. Thus, when the microcontroller 40 supplies current to the light emitting device 10 through the B channel 42, current may pass through the temperature sensor 30.

The current supplied to the light emitting device 10 may be limited by the electrical resistance value of the temperature sensor 30. For example, when ambient temperature decreases and thus the electrical resistance value of the temperature sensor 30 increases, current supplied to the light emitting device 10 may decrease, and when ambient temperature increases and thus the electrical resistance value of the temperature sensor 30 decreases, current supplied to the light emitting device 10 may increase. As described above, current supplied to the light emitting device 10 through the temperature sensor 30 may increase with an increase in ambient temperature, and decrease with a decrease in ambient temperature.

The microcontroller 40 may supply current to the light emitting device 10 by applying a voltage through the A channel 41 or the B channel 42, and receive current output from the light receiving device 20 through the C channel 43. The microcontroller 40 may measure current output from the light receiving device 20, and convert a magnitude of the measured current into digital current data using an analog-to-digital converter. In addition, the microcontroller 40 may process the digital current data to calculate a distance to an object or to determine presence/absence of an object (for example, if it rains).

For example, as shown in FIG. 2, the microcontroller 40 may apply a voltage through the A channel 41 so as to supply current to the light emitting device 10, and receive current output from the light receiving device 20. The microcontroller 40 may measure the current output from the light receiving device 20 to calculate a distance to an object or determine presence/absence of an object (for example, if it rains) based on a magnitude of the measured current.

Herein, an intensity of light output from the light emitting device 10 may vary with temperature. As a result, an intensity of light received by the light receiving device 20 may also vary with temperature, and a magnitude of current output from the light receiving device 20 to the microcontroller 40 may also vary with temperature.

For example, as shown in FIG. 3, as temperature increases, an intensity of light output from the light emitting device 10 may increase, and thus a magnitude of current received by the microcontroller 40 from the light receiving device 20 may also increase. In addition, when ambient temperature reaches specific temperature, an intensity of light output from the light emitting device 10 may be saturated, and thus a magnitude of current received by the microcontroller 40 from the light receiving device 20 may also be saturated.

The microcontroller 40 may control current to be supplied to the light emitting device 10 so that light of a constant intensity is emitted from the light emitting device 10 regardless of temperature.

For example, as shown in FIG. 4, the microcontroller 40 may apply a voltage to the light emitting device 10 through the B channel 42 to supply current, and may receive current output from the light receiving device 20. The microcontroller 40 may measure the current output from the light receiving device 20 while supplying the current to the light emitting device 10 through the B channel 42, and control a voltage to be applied to the light emitting device 10 through the A channel 41 in accordance with the output of the light receiving device 20 measured while supplying the current to the light emitting device 10 through the B channel 42. In other words, the microcontroller 40 may adjust current that is supplied to the light emitting device 10 through the A channel 41.

If the microcontroller 40 outputs a voltage to the light emitting device 10 through the B channel 42, current to be supplied to the light emitting device 10 may be limited by the temperature sensor 30. In other words, current that is supplied to the light emitting device 10 through the B channel 42 may vary depending on temperature.

As shown in FIG. 5, as temperature increases, current that is supplied to the light emitting device 10 through the temperature sensor 30 may increase, and an intensity (amount of light) of light emitted from the light emitting device 10 may increase. As a result, current received by the microcontroller 40 from the light receiving device 20 may also increase.

While applying a voltage to the light emitting device 10 through the B channel 42 (via the temperature sensor), the microcontroller 40 may determine a change in temperature based on a change in current received from the light receiving device 20. In addition, the microcontroller 40 may control a magnitude of current to be supplied to the light emitting device 10 through the A channel 41 in order to compensate for a change in temperature.

For example, if current received from the light receiving device 20 increases when the microcontroller 40 supplies current to the light emitting device 10 through the B channel 42 (via the temperature sensor 30), the microcontroller 40 may determine that an intensity of light emitted from the light emitting device 10 has increased and ambient temperature has increased. Then, the microcontroller 40 may decrease current to be supplied to the light emitting device 10 through the A channel 41 so that light of a constant intensity is emitted from the light emitting device 10 regardless of temperature.

When current received from the light receiving device 20 decreases while the microcontroller 40 supplies current to the light emitting device 10 through the B channel 42 (via the temperature sensor 30), the microcontroller 40 may determine that an intensity of light emitted from the light emitting device 10 has decreased and ambient temperature has decreased. Then, the microcontroller 40 may decrease current to be supplied to the light emitting device 10 through the A channel 41 so that light of a constant intensity is emitted from the light emitting device 10 regardless of temperature.

Figure 6:
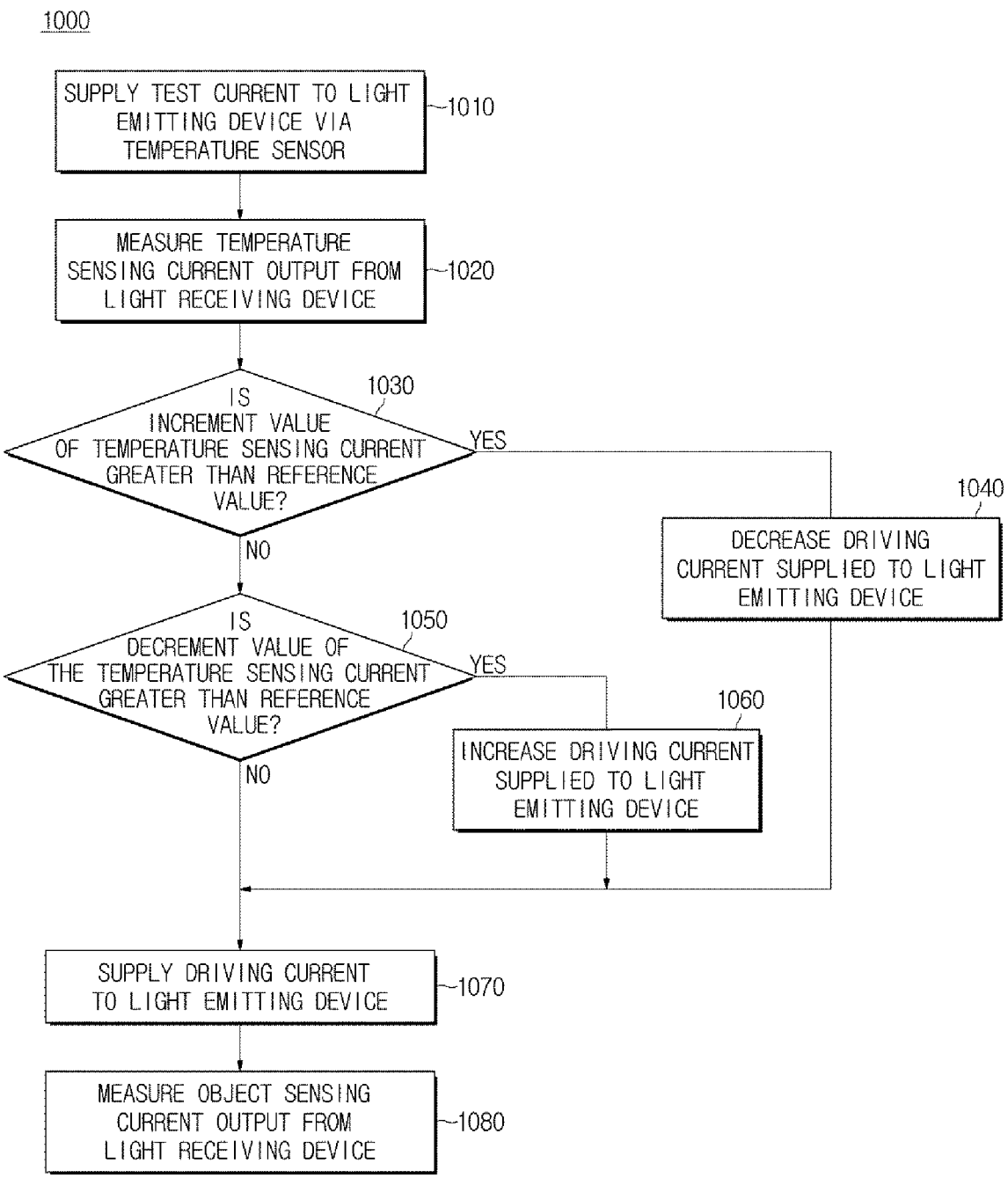
FIG. 6 is a flowchart illustrating an operation of an optical sensor in one form of the present disclosure.
Figure 7:
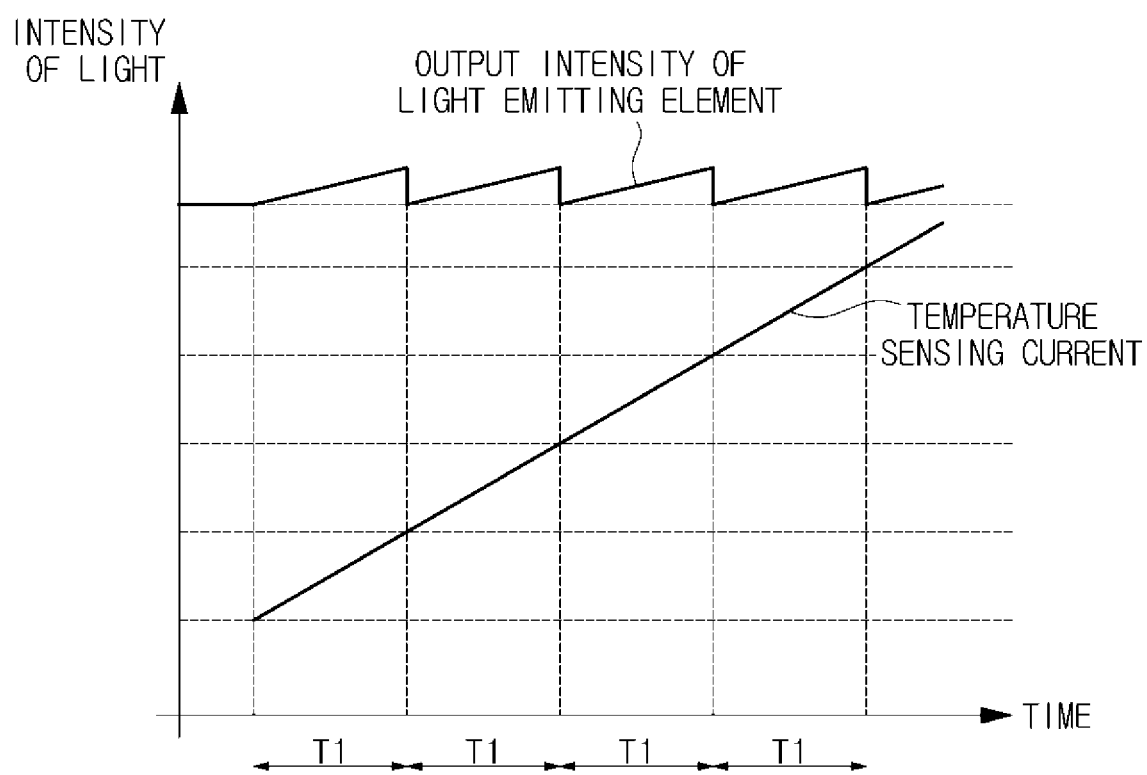
FIGS. 7 and 8 are graphs showing outputs of a light receiving device according to the operation of the optical sensor shown in FIG. 6.
Figure 8:
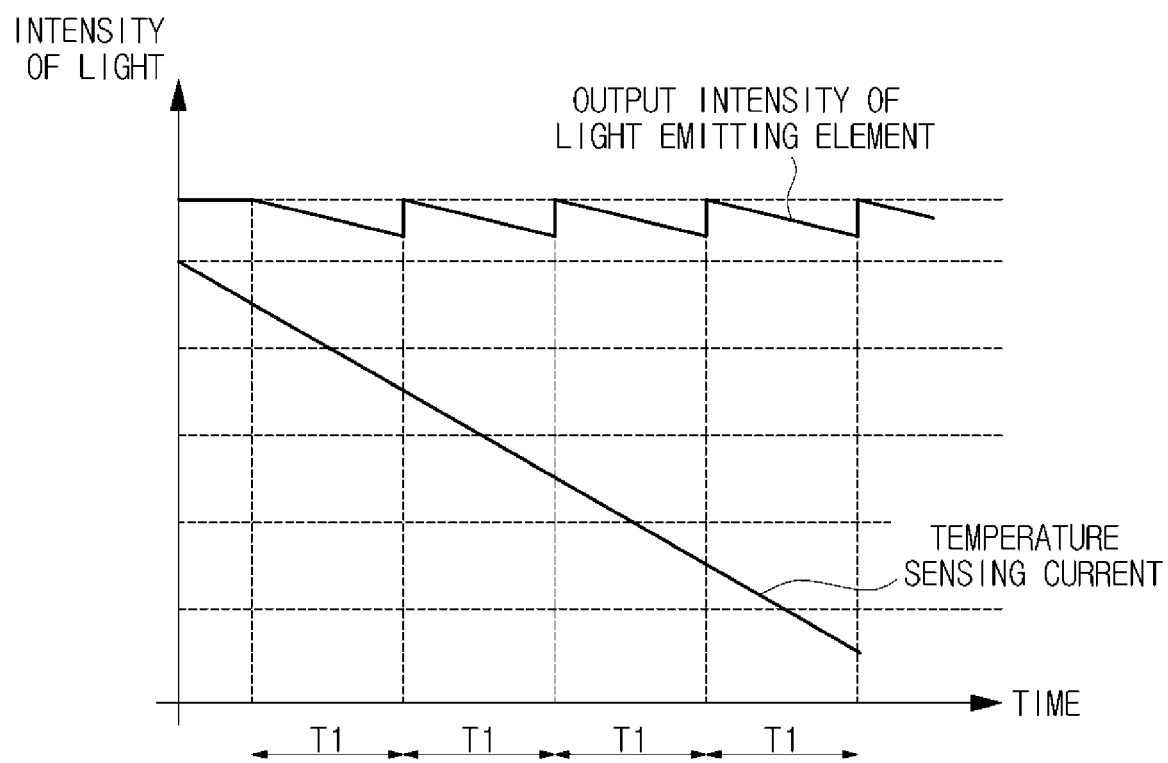

FIG. 6 is a flowchart illustrating an operation of an optical sensor in some forms of the present disclosure. FIGS. 7 and 8 are graphs showing outputs of a light receiving device according to the operation of the optical sensor shown in FIG. 6.

Referring to FIGS. 6, 7, and 8, an operation 1000 of the optical sensor 1 will be described.

The optical sensor 1 may supply test current to the light emitting device 10 through the temperature sensor 30, in operation 1010.

The microcontroller 40 may apply a voltage to the light emitting device 10 through the B channel 42, and when the microcontroller 40 outputs the voltage to the light emitting device 10 through the B channel 42, the test current supplied to the light emitting device 10 may be limited by the temperature sensor 30. In other words, test current that is supplied to the light emitting device 10 through the B channel 42 may vary with temperature. As temperature increases, test current that is supplied to the light emitting device 10 through the temperature sensor 30 may increase, and an intensity (light amount) of light emitted from the light emitting device 10 may increase accordingly. As temperature decreases, test current supplied to the light emitting device 10 through the temperature sensor 30 may decrease, and an intensity (light amount) of light emitted from the light emitting device 10 may decrease accordingly.

The optical sensor 1 may measure temperature sensing current output from the light receiving device 20, in an operation 1020.

The light receiving device 20 may receive light emitted from the light emitting device 10, and output different current according to intensities of the received light. The microcontroller 40 may measure a magnitude of the temperature sensing current output from the light receiving device 20, while applying the voltage to the light emitting device 10 through the B channel 42 (via the temperature sensor 30).

The optical sensor 1 may determine whether an increment value of the temperature sensing current of the light receiving device 20 is greater than a reference value, in operation 1030.

The microcontroller 40 may store the temperature sensing current of the light receiving device 20, and compare an increment value of the temperature sensing current of the light receiving device 20 measured for a predetermined time T1 to the reference value.

If the increment value of the temperature sensing current of the light receiving device 20 is greater than the reference value ("YES" in operation 1030), the optical sensor 1 may decrease driving current to be supplied to the light emitting device 10, in operation 1040.

If the increment value of the temperature sensing current of the light receiving device 20 is greater than the reference value, the microcontroller 40 may determine that test current that is supplied to the light emitting device 10 through the temperature sensor 30 has increased and ambient temperature has increased.

Accordingly, the microcontroller 40 may decrease driving current to be supplied to the light emitting device 10 so that light of a constant intensity is emitted from the light emitting device 10 regardless of temperature. The microcontroller 40 may decrease a voltage to be applied to the light emitting device 10 through the A channel 41 to decrease driving current to be supplied to the light emitting device 10.

As shown in FIG. 7, if the temperature sensing current of the light receiving device 20 increases, it may be determined that the intensity of light output from the light emitting device 10 has increased. Accordingly, the microcontroller 40 may suppress an increase in intensity of light output from the light emitting device 10 by decreasing driving current to be supplied to the light emitting device 10. As a result, the microcontroller 40 may maintain an intensity of light output from the light emitting device 10 within a predetermined range.

When the increment value of the temperature sensing current of the light receiving device 20 is not greater than the reference value ("NO" in operation 1030), the optical sensor 1 may determine whether a decrement value of the temperature sensing current of the light receiving device 20 is greater than the reference value, in operation 1050.

The microcontroller 40 may store the temperature sensing current of the light receiving device 20, and compare a decrement value of the temperature sensing current of the light receiving device 20 measured for the predetermined time T1 to the reference value.

If the decrement value of the temperature sensing current of the light receiving device 20 is greater than the reference value ("YES" in operation 1050), the optical sensor 1 may increase driving current to be supplied to the light emitting device 10, in operation 1060.

If the decrement value of the temperature sensing current of the light receiving device 20 is greater than the reference value, the microcontroller 40 may determine that the test current supplied to the light emitting device 10 via the temperature sensor 30 has decreased and that ambient temperature has decreased.

Accordingly, the microcontroller 40 may increase driving current to be supplied to the light emitting device 10 so that light of a constant intensity is emitted from the light emitting device 10 regardless of temperature. The microcontroller 40 may increase driving current to be supplied to the light emitting device 10 by increasing a voltage to be applied to the light emitting device 10 through the A channel 41.

As shown in FIG. 8, if the temperature sensing current of the light receiving device 20 decreases, it may be determined that the intensity of the light output from the light emitting device 10 has decreased. Accordingly, the microcontroller 40 may suppress a decrease in intensity of light output from the light emitting device 10 by increasing driving current that is supplied to the light emitting device 10. As a result, the microcontroller 40 may maintain the intensity of light output from the light emitting device 10 within a predetermined range.

If the decrement value of the temperature sensing current of the light receiving device 20 is not greater than the reference value ("NO" in operation 1050), the optical sensor 1 may supply driving current to the light emitting device 10, in operation 1070. The optical sensor 1 may supply driving current to the light emitting device 10 even after increasing or decreasing the driving current that is supplied to the light emitting device 10.

The microcontroller 40 may apply a voltage to the light emitting device 10 through the A channel 41 to supply driving current to the light emitting device 10 in order to detect an object or to measure a distance to the object.

The light emitting device 10 may emit light of different intensities according to different magnitudes of supplied driving current.

Thereafter, the optical sensor 1 may measure object sensing current output from the light receiving device 20, in operation 1080.

The light receiving device 20 may receive light emitted from the light emitting device 10 or light emitted from the light emitting device 10 and then reflected from the object, and output different current according to an intensity of the received light. The microcontroller 40 may measure a magnitude of object sensing current output from the light receiving device 20, while applying a voltage to the light emitting device 10 through the A channel 41.

In addition, the microcontroller 40 may calculate a distance to the object and/or determine presence/absence of the object based on the magnitude of the object sensing current of the light receiving device 20.

As described above, the optical sensor 1 may supply test current to the light emitting device 10 via the temperature sensor 30 in order to compensate for a change in temperature. The optical sensor 1 may adjust driving current to be supplied to the light emitting device 10 according to the temperature sensing current of the light receiving device 20, while supplying the test current to the light emitting device 10 via the temperature sensor 30. As a result, the optical sensor 1 may maintain an intensity of light output from the light emitting device 10 within a predetermined range regardless of a change in ambient temperature.

Hereinafter, a vehicle including the optical sensor 1 in some forms of the present disclosure will be described.

Figure 9:
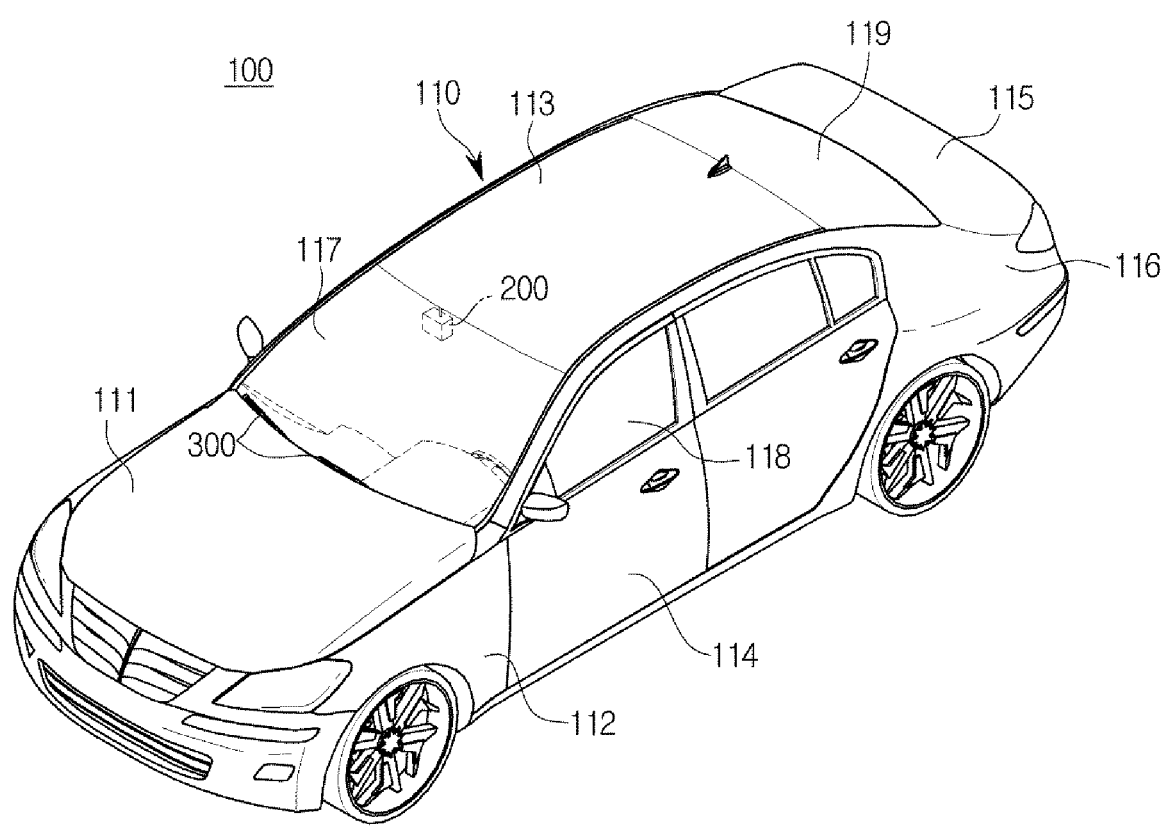
FIG. 9 shows a vehicle in one form of the present disclosure.
Figure 10:
FIG. 10 is a block diagram showing a configuration of a vehicle in one form of the present disclosure.

FIG. 9 shows a vehicle in some forms of the present disclosure. FIG. 10 is a block diagram showing a configuration of a vehicle in some forms of the present disclosure.

Referring to FIGS. 9 and 10, a vehicle 100 may include a hood 111; a front fender 112; a roof panel 113; a door 114; a trunk lid 115; and a quarter panel 116. In order to secure a driver's clear view, a front window 117 may be installed in a front portion of the body 110, a plurality of side windows 118 may be installed in sides of the body 110, and a rear window 119 may be installed in a rear portion of the body 110.

A rain sensor 200 for sensing rainwater may be provided in the inside of the front window 117, and a wiper 300 for removing rainwater when it rains may be provided on the front window 117. A controller (e.g., a body control module (BCM)) 400 for controlling an operation of the wiper 300 according to an output of the rain sensor 200 may be provided.

The rain sensor 200 may sense raindrops formed on the front window 117 using light.

Hereinafter, the rain sensor 200 will be described.

Figure 11:
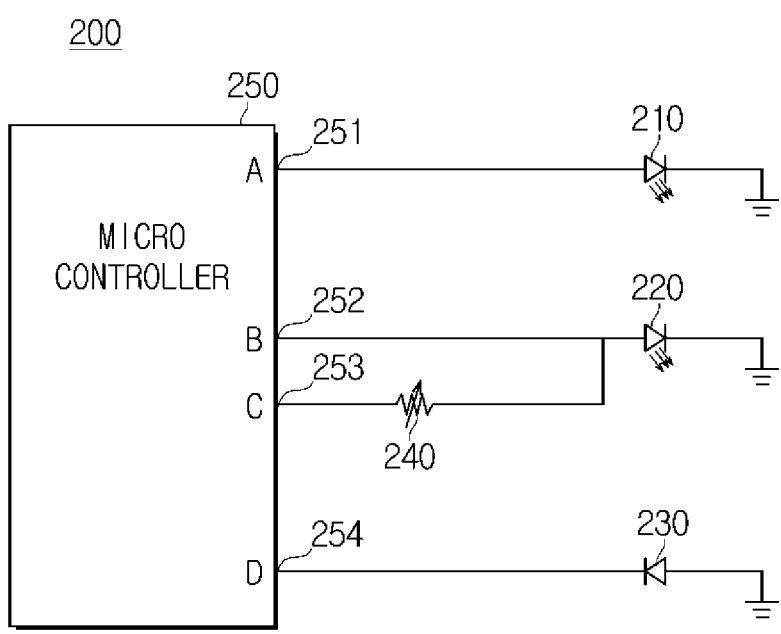
FIG. 11 is a circuit diagram showing a configuration of a rain sensor in one form of the present disclosure.
Figure 12:
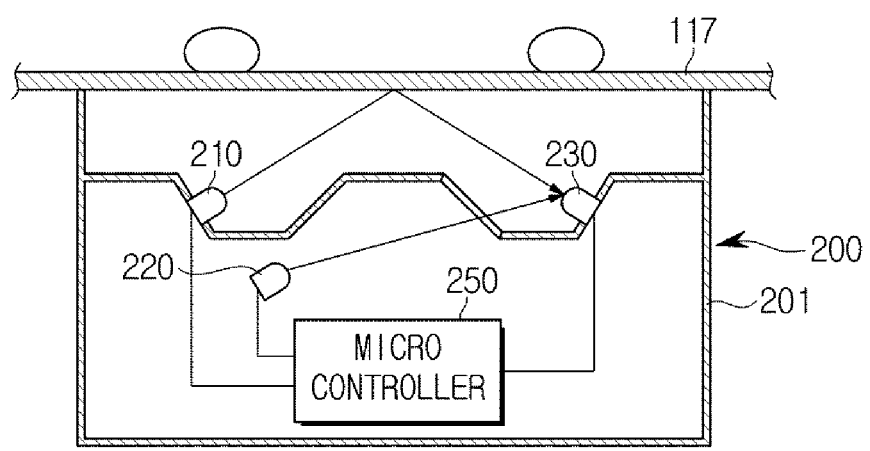
FIG. 12 shows a structure of a rain sensor in one form of the present disclosure.

FIG. 11 is a circuit diagram showing a configuration of a rain sensor in some forms of the present disclosure. FIG. 12 shows a structure of a rain sensor in some forms of the present disclosure;

Referring to FIGS. 11 and 12, the rain sensor 200 may be installed in the inside of the front window 117, and include a housing 201 for protecting internal components. In the housing 201, a first light emitting device 210 and a second light emitting device 220 for emitting light, a light receiving device 230 for receiving light, a temperature sensor 240 having an electrical characteristic changing according to temperature and a microcontroller 250 for controlling an operation of the rain sensor 200 may be provided.

The first light emitting device 210 and the second light emitting device 220 may be supplied with power, and may emit light having a predetermined wavelength (or frequency). In particular, the first light emitting device 210 and the second light emitting device 220 may emit light of different intensities (or amounts of light) according to magnitudes of supplied current. Specifically, as a magnitude of supplied current increases, an intensity of light emitted by the first and second light emitting devices 210 and 220 may increase.

As shown in FIG. 12, the first light emitting device 210 may be exposed to the outside through the front window 117, and may emit light toward the front window 117. If it does not rain, light emitted from the first light emitting device 210 may be reflected (totally reflected) by the front window 117, and the reflected light may be propagated toward the light receiving device 230. Meanwhile, if it rains, light emitted from the first light emitting device 210 may be emitted to the outside of the vehicle 100 via the front window 117.

The first light emitting device 210 may emit light under a control of the microcontroller 250. The first light emitting device 210 may receive current from the microcontroller 250 through the A channel 251.

As shown in FIG. 12, the second light emitting device 220 may be installed inside the housing 201, and may emit light directly toward the light receiving device 230.

The second light emitting device 220 may emit light under a control of the microcontroller 250. The second light emitting device 220 may receive current from the microcontroller 250 through a B channel 252 or a C channel 253.

The first light emitting device 210 and the second light emitting device 220 may be, for example, a LED.

The light receiving device 230 may receive light, and output current. The light receiving device 230 may receive light emitted from the first light emitting device 210 or light emitted from the second light emitting device 220. In particular, the light receiving device 230 may output current of different magnitudes depending on intensities of received light. Specifically, as an intensity of the received light increases, a magnitude of current output by the light receiving device 230 may increase.

The light receiving device 230 may output current corresponding to the intensity of the received light to the microcontroller 250. The light receiving device 230 may output the current to the microcontroller 250 through a D channel 254 of the microcontroller 250.

The light receiving device 230 may be, for example, a photo diode.

An electrical characteristic of the temperature sensor 240 may vary depending on the ambient temperature. For example, the temperature sensor 240 may change an electrical resistance value depending on the ambient temperature.

The temperature sensor 240 may include, for example, a thermistor whose electrical resistance varies with temperature. In particular, the temperature sensor 240 is assumed to be a NTC thermistor in the following description.

One end of the temperature sensor 240 may be coupled with the C channel 253 of the microcontroller 250, and the other end of the temperature sensor 240 may be coupled with the second light emitting device 220. Accordingly, when the microcontroller 250 supplies current to the second light emitting device 220 through the C channel 253, the current may pass through the temperature sensor 240.

The current supplied to the second light emitting device 220 may be limited by an electrical resistance value of the temperature sensor 240. Specifically, the current supplied to the second light emitting device 220 may be limited by the electrical resistance value of the temperature sensor 240 according to temperature.

The microcontroller 250 may supply current to the first light emitting device 210 by applying a voltage through the A channel 251, supply current to the second light emitting device 220 by applying a voltage through the B channel 252 or the C channel 253, and receive current output from the light receiving device 230 though the D channel 245. The microcontroller 250 may measure current output from the light receiving device 230, and may determine rainfall or ambient temperature according to the measured current value The microcontroller 250 may supply current to the first light emitting device 210 through the A channel 251, and receive current output from the light receiving device 230. The microcontroller 250 may measure the current output from the light receiving device 230, and determine whether or not it rains, depending on a magnitude of the measured current.

For example, if current output from the light receiving device 230 is greater than reference current while the microcontroller 250 supplies current to the first light emitting device 210, the microcontroller 250 may determine that it does not rain, and if the current output from the light receiving device 230 is smaller than the reference current while the microcontroller 250 supplies current to the first light emitting device 210, the microcontroller 250 may determine that it rains.

The microcontroller 250 may supply current to the second light emitting device 220 through the C channel 253, and receive current output from the light receiving device 230. The microcontroller 250 may measure the current output from the light receiving device 230, and estimate temperature according to a magnitude of the measured current. Also, the microcontroller 250 may adjust a magnitude of current supplied to the first light emitting device 210 through the A channel 251, according to a magnitude of current output from the light receiving device 230 while supplying current to the second light emitting device 220 through the channel C 253.

For example, if an increment value of current output from the light receiving device 230 is greater than a reference value while the microcontroller 250 supplies current to the second light emitting device 220 through the C channel 253, the microcontroller 250 may determine that temperature has increased, and decrease the current supplied to the first light emitting device 210 through the A channel 251. If a decrement value of current output from the light receiving device 230 is greater than the reference value while the microcontroller 250 supplies current to the second light emitting device 220 through the C channel 253, the microcontroller 250 may determine that temperature has decreased, and increase the current supplied to the first light emitting device 210 through the A channel 251.

As a result, the first light emitting device 210 may emit light of a constant intensity regardless of changes in temperature.

Figure 13:
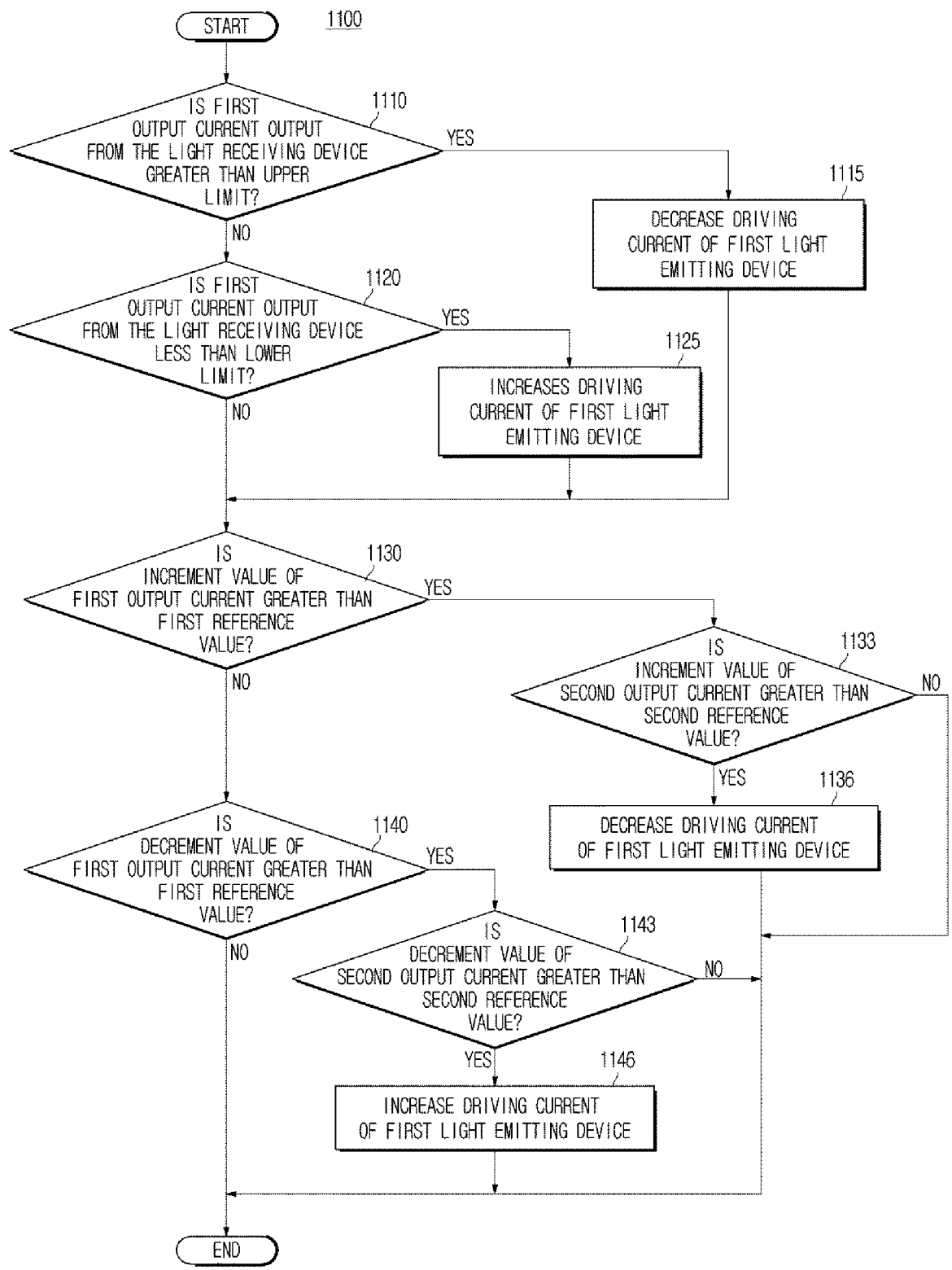
FIG. 13 is a flowchart illustrating an example of an operation of the rain sensor in one form of the present disclosure.
Figure 14:
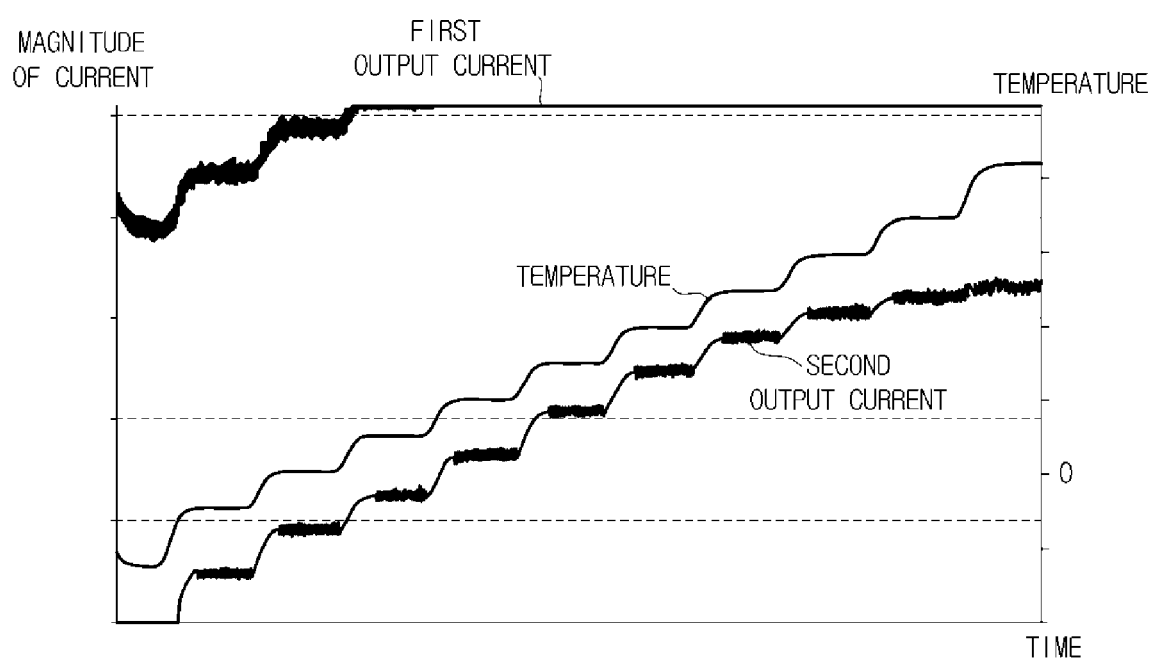
FIG. 14 is a graph showing an output of the light receiving device when a temperature compensation operation shown in FIG. 13 is not performed.
Figure 15:
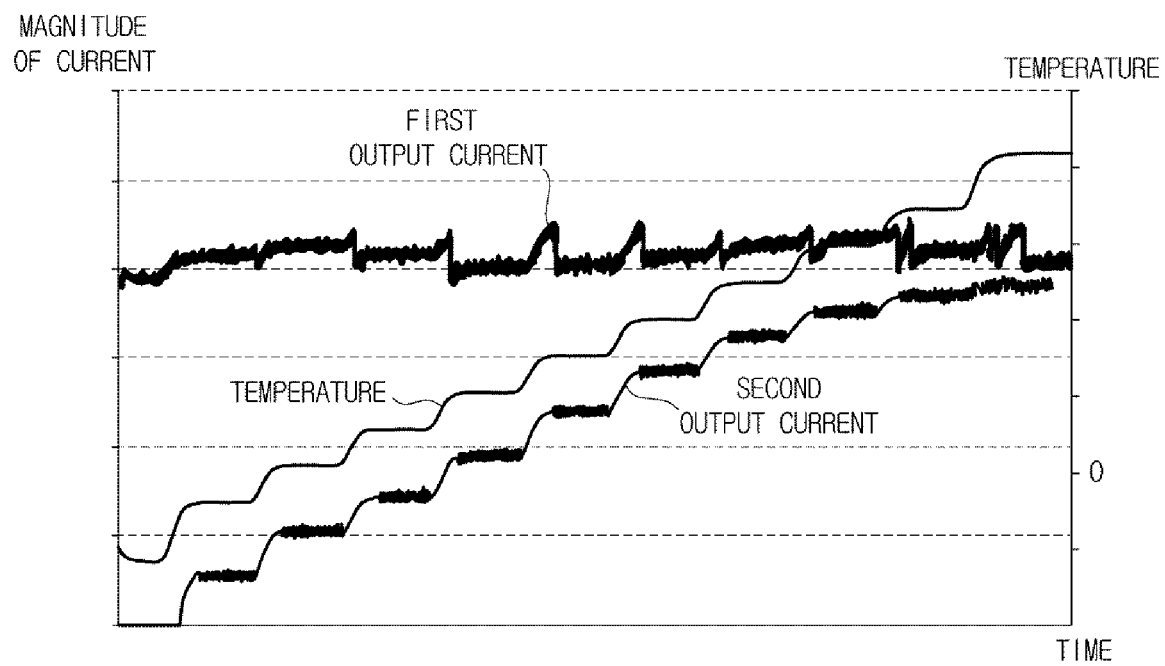
FIG. 15 is a graph showing an output of the light receiving device when the temperature compensation operation shown in FIG. 13 is performed.

FIG. 13 is a flowchart illustrating an example of an operation of the rain sensor in some forms of the present disclosure. FIG. 14 is a graph showing an output of the light receiving device when the temperature compensation operation shown in FIG. 13 is not performed. FIG. 15 is a graph showing an output of the light receiving device when the temperature compensation operation shown in FIG. 13 is performed.

Specifically, FIG. 13 shows an operation 1100 of the rain sensor 200 when it does not rain.

The rain sensor 200 may determine whether a value of first output current output from the light receiving device 230 is greater than an upper limit value after current is supplied to the first light emitting device 210, in operation 1110.

The microcontroller 250 may apply a voltage through the A channel 251 to supply current to the first light emitting device 210. When current is supplied from the microcontroller 250, the first light emitting device 210 may emit light, and the light receiving device 230 may receive the light emitted from the first light emitting device 210. The light receiving device 230 may output current corresponding to an intensity of the received light to the microcontroller 250. The microcontroller 250 may measure current (first output current) output from the light receiving device 230 while supplying current to the first light emitting device 210, and compare a value of the first output current output from the light receiving device 230 to the upper limit value.

If the value of the first output current is greater than the upper limit value ("YES" in operation 1110), the rain sensor 200 may decrease driving current of the first light emitting device 210, in operation 1115.

If the value of the first output current indicating the intensity of the light output from the first light emitting device 210 is greater than the upper limit value, the microcontroller 250 may decrease current to be supplied to the first light emitting device 210 through the A channel 251 such that the intensity of the light output from the first light emitting device 210 is within a predetermined range.

If the value of the first output current is not greater than the upper limit value ("NO" in operation 1110), the rain sensor 200 may determine whether the value of the first output current from the light receiving device 230 is smaller than a lower limit value while current is supplied to the first light emitting device 210, in operation 1120.

The microcontroller 250 may measure current (first output current) output from the light receiving device 230 while supplying current to the first light emitting device 210, and compare a value of the first output current with the lower limit value.

If the value of the first output current is smaller than the lower limit value ("YES" in operation 1120), the rain sensor 200 may increase driving current of the first light emitting device 210, in operation 1125.

If the value of the first output current indicating the intensity of the light output from the first light emitting device 210 is greater than the lower limit value, the micro controller 250 may increase current to be supplied to the first light emitting device 210 through the A channel 251 such that the intensity of the light output from the first light emitting device 210 is within the predetermined range.

If the value of the first output current is not smaller than the lower limit value ("NO" in operation 1120), the rain sensor 200 may determine whether an increment value of the first output current output from the light receiving device 230 is greater than a first reference value, in operation 1130.

The microcontroller 250 may measure the first output current while supplying current to the first light emitting device 210, and calculate an increment value of the first output current measured for a predetermined time. In addition, the microcontroller 250 may compare the increment value of the first output current to the first reference value.

If the increment value of the first output current is greater than the first reference value ("YES" in operation 1130), the rain sensor 200 may supply current to the second light emitting device 220 via the temperature sensor 240, and determine whether an increment value of second output current output from the light receiving device 230 is greater than a second reference value, in operation 1133.

The microcontroller 250 may apply a voltage through the C channel 253 to supply current to the second light emitting device 220 through the temperature sensor 240. The current supplied to the second light emitting device 220 through the temperature sensor 240 may vary with temperature.

The microcontroller 250 may measure current (second output current) output from the light receiving device 230 while supplying the current to the second light emitting device 220, and calculate an increment value of the second output current measured for the predetermined time. In addition, the microcontroller 250 may compare the increment value of the second output current to the second reference value.

If the increment value of the second output current is greater than the second reference value ("YES" in operation 1133), the rain sensor 200 may decrease driving current of the first light emitting device 210, in operation 1136.

If the increment value of the first output current is greater than the first reference value, and the increment value of the second output current is greater than the second reference value, the microcontroller 250 may determine that an intensity of light output from the first light emitting device 210 has increased due to an increase in temperature. Accordingly, the microcontroller 250 may decrease the driving current of the first light emitting device 210 to maintain the intensity of the light output from the first light emitting device 210 constant.

If the increment value of the second output current is not greater than the second reference value ("NO" in operation 1133), the rain sensor 200 may terminate operation 1100 in order to look for another cause than an increase in temperature.

If the increment value of the first output current is not greater than the first reference value ("NO" in operation 1130), the rain sensor 200 may determine whether a decrement value of the first output current output from the light receiving device 230 is greater than the first reference value, in operation 1140.

The microcontroller 250 may measure the first output current while supplying current to the first light emitting device 210, and calculate a decrement value of the first output current measured for a predetermined time. In addition, the microcontroller 250 may compare the decrement value of the first output current to the first reference value.

If the decrement value of the first output current is greater than the first reference value ("YES" in operation 1140), the rain sensor 200 may supply current to the second light emitting device 220 through the temperature sensor 240, and determine whether the decrement value of the second output current output from the light receiving device 230 is greater than the second reference value, in operation 1143.

The microcontroller 250 may measure current (second output current) output from the light receiving device 230 while supplying the current to the second light emitting device 220, and calculate a decrement value of the second output current measured for a predetermined time. In addition, the microcontroller 250 may compare the decrement value of the second output current to the second reference value.

If the decrement value of the second output current is greater than the second reference value ("YES" in operation 1143), the rain sensor 200 may increase driving current of the first light emitting device 210, in operation 1146.

If the increment value of the first output current is greater than the first reference value, and the increment value of the second output current is greater than the second reference value, the microcontroller 250 may determine that an intensity of light output from the first light emitting device 210 has increased due to an increase in temperature. Accordingly, the microcontroller 250 may decrease driving current of the first light emitting device 210 in order to maintain an intensity of light output from the first light emitting device 210 constant.

If the decrement value of the second output current is not greater than the second reference value ("NO" in operation 1143), the rain sensor 200 may terminate operation 1100 in order to look for another cause other than an increase in temperature.

If the decrement value of the first output current is not greater than the first reference value ("NO" in operation 1140), the rain sensor 200 may terminate operation.

As described above, the rain sensor 200 may compensate for a change in intensity of light output from the first light emitting device 210 due to a change in temperature by using the temperature sensor 240 and the second light emitting device 220.

If a change in intensity of light output from the first light emitting device 210 due to a change in temperature is not compensated, the first output current of the light receiving device 230 may increase with an increase in temperature regardless of whether or not it rains, as shown in FIG. 14. Accordingly, the rain sensor 200 may malfunction due to the change in temperature.

However, if a change in intensity of light output from the first light emitting device 210 due to a change in temperature is compensated, the first output current of the light receiving device 230 may be kept constant regardless of an increase in temperature, as shown in FIG. 15. Accordingly, a malfunction of the rain sensor 200 due to a change in temperature may be prevented.

Figure 16:
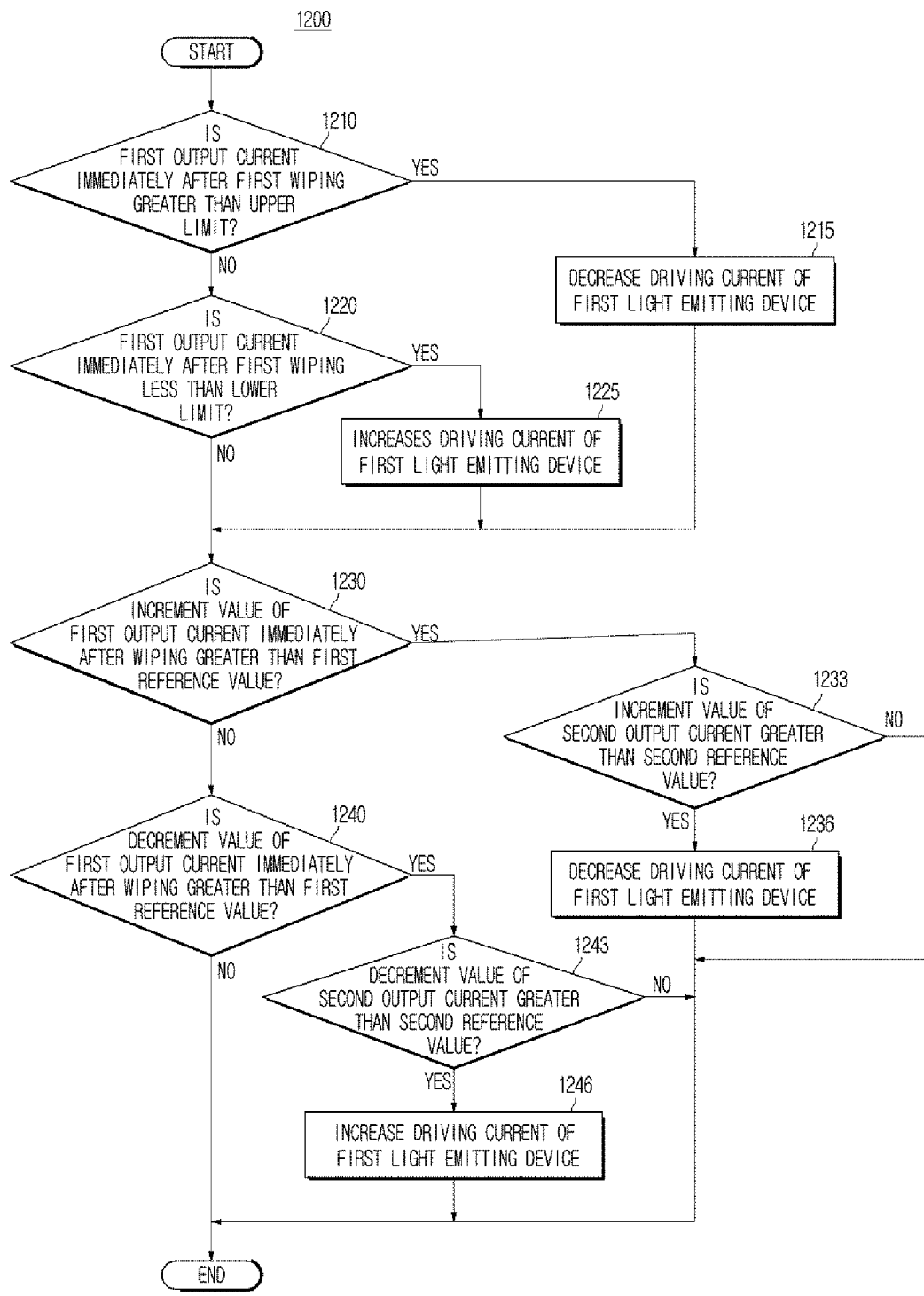
FIG. 16 is a flowchart illustrating another example of an operation of a rain sensor in one form of the present disclosure.
Figure 17:
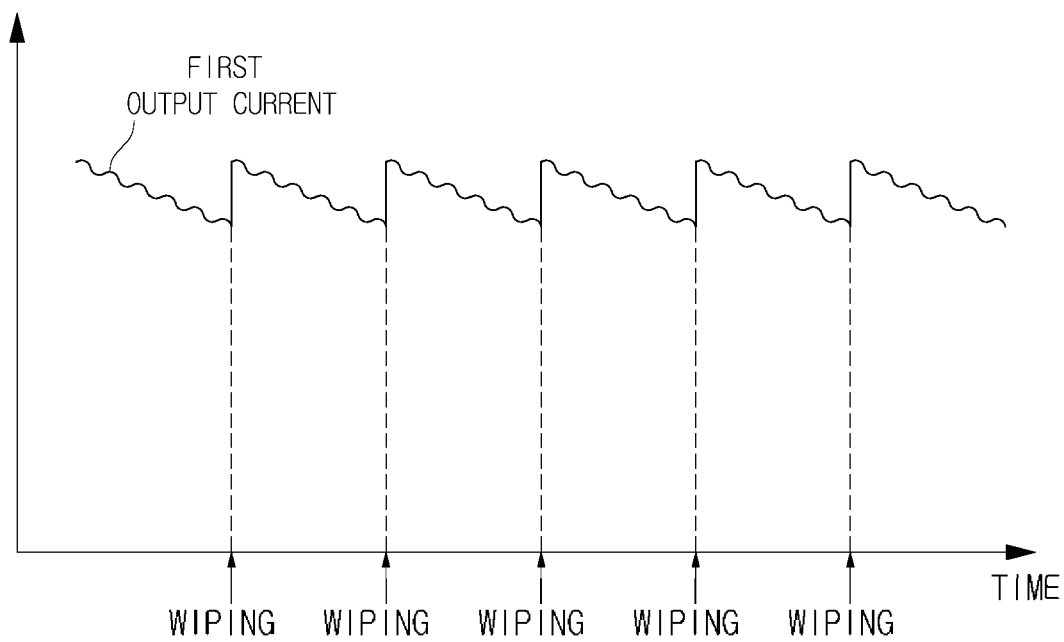
FIG. 17 is a graph showing an example of an output of the light receiving device by a wiping operation.

FIG. 16 is a flowchart illustrating another example of an operation of a rain sensor in some forms of the present disclosure. FIG. 17 is a graph showing an example of an output of the light receiving device by a wiping operation.

Specifically, FIG. 16 shows operation 1200 of the rain sensor 200 when it rains.

The rain sensor 200 may supply current to the first light emitting device 210, and determine whether first output current output from the light receiving device 230 immediately after first wiping operation is greater than an upper limit value, in operation 1210.

Light emitted from the first light emitting device 210 when it rains may be emitted to an outside of the vehicle 100 without being reflected from the front window 117. Accordingly, first output current output from the light receiving device 230 when it rains may have a maximum value immediately after a wiping operation and then gradually decrease, as shown in FIG. 17.

Accordingly, in order to measure an intensity of light emitted from the first light emitting device 210, the microcontroller 250 may supply current to the first light emitting device 210 through the A channel 251, and measure current (first output current) output from the light receiving device 230 immediately after the wiping operation is performed. In addition, the microcontroller 250 may compare a value of the first output current output from the light receiving device 230 to the upper limit value.

If the first output current is greater than the upper limit value ("YES" in operation 1210), the rain sensor 200 may decrease driving current of the first light emitting device 210, in operation 1215.

Operation 1215 may be the same as operation 1115 shown in FIG. 13.

If the first output current is not greater than the upper limit value ("NO" in operation 1210), the rain sensor 200 may supply current to the first light emitting device 210, and determine whether the first output current output from the light receiving device 230 immediately after first wiping operation is smaller than a lower limit value, in operation 1220.

The microcontroller 250 may measure current (first output current) output from the light receiving device 230 immediately after the wiping operation is performed, and compare the first output current value output from the light receiving device 230 to the lower limit value.

If the first output current is smaller than the lower limit value ("YES" in operation 1220), the rain sensor 200 may increase the driving current of the first light emitting device 210, in operation 1225.

Operation 1225 may be the same as operation 1125 shown in FIG. 13.

If the first output current is not smaller than the lower limit value ("NO" in operation 1220), the rain sensor 200 may determine whether an increment value of the first output current of the light receiving device 230 measured immediately after the wiping operation is greater than a first reference value, in operation 1230

The microcontroller 250 may measure first output current immediately after the wiping operation, and calculate an increment value of the first output current measured for a predetermined time. In addition, the microcontroller 250 may compare the increment value of the first output current to the first reference value.

If the increment value of the first output current is greater than the first reference value ("YES" in operation 1130), the rain sensor 200 may supply current to the second light emitting device 220 via the temperature sensor 240, and determine whether an increment value of second output current of the light receiving device 230 measured immediately after the wiping operation is greater than a second reference value, in operation 1233.

The microcontroller 250 may supply current to the second light emitting device 220 through the C channel 253, and measure current (second output current) output from the light receiving device 230 immediately after the wiping operation is performed. In addition, the microcontroller 250 may calculate an increment value of the second output current for a predetermined time, and compare the increment value of the second output current to the second reference value.

If the increment value of the second output current is greater than the second reference value ("YES" in operation 1233), the rain sensor 200 may decrease driving current of the first light emitting device 210, in operation 1236.

The operation 1236 may be the same as operation 1136 shown in FIG. 13.

If the increment value of the first output current is not greater than the first reference value ("NO" in operation 1230), the rain sensor 200 may determine whether the decrement value of the first output current output from the light receiving device 230 is greater than the first reference value, in operation 1240.

The microcontroller 250 may measure the first output current immediately after the wiping operation is performed while supplying current to the first light emitting device 210, and calculate a decrement value of the first output current for the predetermined time. In addition, the microcontroller 250 may compare the decrement value of the first output current to the first reference value.

If the decrement value of the first output current is greater than the first reference value ("YES" in operation 1240), the rain sensor 200 may supply current to the second light emitting device 220 via the temperature sensor 240, and determine whether a decrement value of the second output current output from the light receiving device 230 immediately after the wiping operation is greater than the second reference value, in operation 1243.

The microcontroller 250 may measure current (second output current) output from the light receiving device 230 immediately after the wiping operation while supplying current to the second light emitting device 220, and calculate a decrement value of the second output current measured for a predetermined time. In addition, the microcontroller 250 may compare the decrement value of the second output current to the second reference value.

If the decrement value of the second output current is greater than the second reference value ("YES" in operation 1243), the rain sensor 200 may increase driving current of the first light emitting device 210, in operation 1246.

Operation 1246 may be the same as operation 1146 shown in FIG. 13.

If the decrement value of the first output current is not greater than the first reference value ("NO" in operation 1240), the rain sensor 200 may terminate operation.

As described above, when it rains, the rain sensor 200 may compensate for a change in intensity of light output from the first light emitting device 210 due to a change in temperature by using the temperature sensor 240 and the second light emitting device 220.

As a result, an intensity of light output from the first light emitting device 210 may be kept constant regardless of changes in temperature, and a malfunction of the rain sensor 200 due to a change in temperature may be prevented.

According to an aspect of the present disclosure, an optical sensor and a rain sensor having constant sensitivity regardless of changes in temperature, and a vehicle including the same may be provided According to another aspect of the present disclosure, an optical sensor and a rain sensor including a light emitting device that emits a constant amount of light regardless of changes in temperature, and a vehicle including the same may be provided.

According to another aspect of the present disclosure, an optical sensor and a rain sensor including a temperature compensation circuit, and a vehicle including the same may be provided.

According to another aspect of the present disclosure, an optical sensor and a rain sensor including a temperature compensation circuit using a thermistor, and a vehicle including the same may be provided.

Although some forms of the present disclosure have been shown and described, it would be appreciated by those skilled in the art that changes may be made in these forms without departing from the principles and spirit of the disclosure, the scope of which is defined in the claims and their equivalents.

Exemplary forms of the present disclosure have been described above. In some forms described above, some components may be implemented as a "module". Here, the term 'module' means, but is not limited to, a software and/or hardware component, such as a Field Programmable Gate Array (FPGA) or Application Specific Integrated Circuit (ASIC), which performs certain tasks. A module may advantageously be configured to reside on the addressable storage medium and configured to execute on one or more processors.

Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The operations provided for in the components and modules may be combined into fewer components and modules or further separated into additional components and modules. In addition, the components and modules may be implemented such that they execute one or more CPUs in a device.

With that being said, and in addition to the above described forms of the present disclosure, forms of the present disclosure can thus be implemented through computer readable code/instructions in/on a medium, e.g., a computer readable medium, to control at least one processing element to implement any above described exemplary form. The medium can correspond to any medium/media permitting the storing and/or transmission of the computer readable code.

The computer-readable code can be recorded on a medium or transmitted through the Internet. The medium may include Read Only Memory (ROM), Random Access Memory (RAM), Compact Disk-Read Only Memories (CD-ROMs), magnetic tapes, floppy disks, and optical recording medium. Also, the medium may be a non-transitory computer-readable medium. The media may also be a distributed network, so that the computer readable code is stored or transferred and executed in a distributed fashion. Still further, as only an example, the processing element could include at least one processor or at least one computer processor, and processing elements may be distributed and/or included in a single device.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A rain sensor comprising:
first light emitting device configured to emit first light;
second light emitting device configured to emit second light;
a light receiving device configured to:
  receive the first light or the second light emitted from at least one of the first lighting emitting device or the second light emitting device; and
  output current based on an intensity of the first light or the second light;
a temperature sensor coupled with the second light emitting device, wherein the temperature sensor has electrical resistance varying with temperature; and
a microcontroller comprising:
  a first channel configured to supply first current directly to the first light emitting device;

a second channel configured to supply second current to the second light emitting device via the temperature sensor; and a third channel configured to receive the current outputted from the light receiving device, wherein the microcontroller is configured to:

adjust a setting value of the first current based on the current output from the light receiving device when the first current is supplied such that an intensity of the light output from the first light emitting device is within a predetermined intensity; and adjust the setting value of the first current based on the current output from the light receiving device for a temperature compensation when the second current is supplied.

2. The rain sensor of claim 1, wherein the microcontroller is configured to determine the setting value of the first current based on the current outputted from the light receiving device when the second current is supplied to the second light emitting device.

3. The rain sensor of claim 2, wherein the microcontroller is configured to:

determine whether rain drops on a front window based on the current outputted from the light receiving device.

4. The rain sensor of claim 1, wherein the microcontroller is configured to:

when the current outputted from the light receiving device is greater than a predetermined upper limit value, decrease the setting value of the first current.

5. The rain sensor of claim 1, wherein the microcontroller is configured to:

when the current outputted from the light receiving device is less than a predetermined lower limit value, increase the setting value of the first current.

6. The rain sensor of claim 1, wherein the microcontroller is configured to:

when the current outputted from the light receiving device increases, supply the second current to the second light emitting device through the second channel; and decrease the setting value of the first current.

7. The rain sensor of claim 1, wherein the microcontroller is configured to:

when the current outputted from the light receiving device decreases, supply the second current to the second light emitting device through the second channel; and decrease the setting value of the first current.

8. A vehicle comprising:

a front window;

a rain sensor configured to detect raindrops on the front window;

a wiper configured to remove the raindrops on the front window; and a controller configured to operate the wiper based on a signal from the rain sensor, wherein the rain sensor comprises:

first light emitting device configured to emit first light;

second light emitting device configured to emit second light;

a light receiving device configured to:

receive the first light or the second light emitted from at least one of the first light emitting device or the second light emitting device; and output current based on an intensity of the first light or the second light;

a temperature sensor coupled with the second light emitting device, wherein the temperature sensor has electrical resistance varying with temperature; and a microcontroller comprising:

a first channel configured to supply first current directly to the first light emitting device;

a second channel configured to supply second current to the second light emitting device via the temperature sensor; and a third channel configured to receive the current outputted from the light receiving device, wherein the microcontroller is configured to:

adjust a setting value of the first current based on the current output from the light receiving device when the first current is supplied such that an intensity of the light output from the first light emitting device is within a predetermined intensity; and adjust the setting value of the first current based on the current output from the light receiving device for a temperature compensation when the second current is supplied.

9. The vehicle of claim 8, wherein the microcontroller is configured to determine the setting value of the first current based on the current outputted from the light receiving device when the second current is supplied to the second light emitting device.

10. The vehicle of claim 9, wherein the microcontroller is configured to:

determine whether rain drops on a front window based on the current outputted from the light receiving device.

11. The vehicle of claim 8, wherein the microcontroller is configured to:

when the current outputted from the light receiving device is greater than a predetermined upper limit value, decrease the setting value of the first current.

12. The vehicle of claim 8, wherein the microcontroller is configured to:

when the current outputted from the light receiving device is less than a predetermined lower limit value, increase the setting value of the first current.

13. The vehicle of claim 8, wherein the microcontroller is configured to:

when the current outputted from the light receiving device increases, supply the second current to the second light emitting device through the second channel; and decrease the setting value of the first current.

14. The vehicle of claim 8, wherein the microcontroller is configured to:

when the current outputted from the light receiving device increases, supply the first current to the first light emitting device through the first channel; and decrease the setting value of the first current.

* * * * *